United States Patent
Javerliac

(10) Patent No.: US 7,944,231 B2
(45) Date of Patent: May 17, 2011

(54) ELECTRONIC DEVICE FOR THE TRANSPORT OF NUMERICAL INFORMATION

(75) Inventor: Virgile Javerliac, St Prim (FR)

(73) Assignees: Commissariat a l'Energie Atomique, Paris (FR); Centre National de la Recherche Scientifique, Paris (FR)

( * ) Notice: Subject to any disclaimer, the term of this patent is extended or adjusted under 35 U.S.C. 154(b) by 540 days.

(21) Appl. No.: 12/053,028

(22) Filed: Mar. 21, 2008

(65) Prior Publication Data

US 2008/0232479 A1    Sep. 25, 2008

(30) Foreign Application Priority Data

Mar. 23, 2007    (FR) .................................... 07 54004

(51) Int. Cl.
*H03K 17/16* (2006.01)
*H03K 19/003* (2006.01)

(52) U.S. Cl. ................ 326/21; 326/22; 326/82; 326/136

(58) Field of Classification Search .................. None
See application file for complete search history.

(56) References Cited

U.S. PATENT DOCUMENTS

| 5,783,284 A | 7/1998 | Shinjo et al. |
| 6,087,882 A * | 7/2000 | Chen et al. ..................... 327/333 |
| 6,859,063 B2 * | 2/2005 | Nuspl et al. ..................... 326/30 |
| 2005/0026307 A1 | 2/2005 | Osipov et al. |

FOREIGN PATENT DOCUMENTS

| EP | 0 093 870 A2 | 11/1983 |
| WO | 99/21332 A1 | 4/1999 |
| WO | 01/25803 A1 | 4/2001 |
| WO | 03/088283 A1 | 10/2003 |

* cited by examiner

*Primary Examiner* — Anh Q Tran
(74) *Attorney, Agent, or Firm* — Burr & Brown

(57) ABSTRACT

An electronic device designed to transport digital information ("0", "1") over long distances, including a transmitter generating current pulses and at least one assembly of receivers converting the received current pulses into logic pulses which are compatible with the operation of standard electronic logic circuits. Each receiver includes a pair of magnetoresistive stacks containing at least one hard ferromagnetic layer and one soft ferromagnetic layer separated by a non-ferromagnetic interlayer, the hard layer of each of the magnetoresistive stacks being pinned in a magnetic orientation perpendicular to an easy-magnetization axis which is used as a reference for the soft layer of the same stack. The soft layer of each magnetoresistive stack has a magnetic orientation which can be modulated by the magnetic field generated by current pulses delivered by the transmitter so as to cause modification of the transverse resistance of the stack sufficient to trigger an electrical signal.

17 Claims, 4 Drawing Sheets

ELECTRONIC DEVICE FOR THE TRANSPORT OF NUMERICAL INFORMATION

FIELD OF THE INVENTION

The present invention relates to an electronic device for transporting digital information over long distances comprising a transmitter associated with a magnetoresistive receiver. The term "digital information" is taken to mean "0s" and "1s" which are also referred to as logic information or signals as opposed to analogue signals.

The present invention therefore relates to the field of IT infrastructure designed for high-speed transmission of data between adjacent or distant components by means of wire connections or lines.

The term "adjacent components" denotes components which are part of a single board whereas the term "distant components" denotes, for example, two peripherals which are more or less far apart such as the graphics card and the monitor of a microcomputer.

BACKGROUND OF THE INVENTION

In the field of microelectronics, processors are currently being fabricated with increasingly higher clock frequencies, ranging typically from several GHz to around 20 GHz in the case of certain prototypes. This improvement in the performance of microprocessors makes it possible to process digital information more and more quickly and hence makes it possible to solve increasingly complex algorithms in an ever shorter time.

This is why attempts are also being made to develop transceiver devices capable of transporting this digital information at increasingly high speeds in order to keep up with the processing speeds of microprocessors.

Transceiver assemblies according to the prior art include electronic devices with various architectures, the operation of which depends on the intended application. The way in which the digital information is transported, i.e. encoded and then decoded, depends on the rate at which information is to be sent and the distance over which the information must be sent. This is why many communication standards have been created in order to meet various specific needs. These standards fall into three categories.

The first category comprises "non-differential" standards, the best-known of these being:

The Low Voltage Transistor Transistor Logic (LVTTL) standard is used over a single-circuit line at a frequency below 250 MHz;

The Gunning Transceiver Logic standard uses a single-circuit line, the transistor drain of which is not connected and operates at frequencies below 200 MHz.

Both these standards are generally used in traditional electronic circuits over relatively short interconnection distances (e.g. the GTL standard or even the external communication bus of Intel's Pentium Pro) and for moderately high bit rates. The AGTL+ standard is derived from the GTL standard and is used to transport high bit rates by means of motherboard buses.

The second category is associated with communication needs between the various elements of a single electronic unit. Where information has to be transferred between memories, significant bandwidth is required, especially for high-speed memories such as Static Random Access Memories (SRAM) and Dynamic Random Access Memories (DRAM). In such applications, one generally uses the High Speed Transceiver Logic (HSTL) standard or the Sub Series Terminated Logic (SSTL) standard which make it possible to transport digital information over very short distances at frequencies of the order of 400 MHz by means of single-circuit or differential lines.

The third category comprises differential standards for transporting very high information rates, typically at frequencies above 800 MHz over long distances, sometimes over several hundred meters, as in the case of Asynchronous Digital Subscriber Line (ADSL) networks, one can employ serial point-to-point links which operate in accordance with Low Voltage Differential Signaling (LVDS), Emitter Coupled Logic (ECL) or Current Mode Logic (CML) standards.

As is known, the LVDS standard uses CMOS-based technology which enables it to achieve a good trade-off between cost, power consumption and performance of the order of 1 Gb/s for a power of 1 mW.

As for the ECL and CML standards, these make it possible to transport information at higher bit rates, typically of the order of 2 Gb/s but with a power consumption which is markedly higher than that in the case of the LVDS standard, typically of the order of 200 mW and at greater cost because these standards use non-standard technology.

The technology employed by the LVDS standard uses small currents of the order of 3.5 mA and a differential connection to transmit information over long distances and this makes it possible to reject most of the noise which affects transmission lines because most of this noise is common mode noise and differential circuits reject an extremely high proportion of such noise. This noise rejection makes it possible to use low voltages and hence reduce power consumption.

The present invention falls in this third category of differential transceivers for long distances which also offer a high information rate, but without any of the disadvantages of the LVDS standard.

According to the LVDS standard, the transmitter output voltage swing is relatively high, of the order of 350 mV, which corresponds to the operation threshold of the gates of the receiver's input transistors. Since operation is differential, the voltage swing equals at least twice this threshold, i.e. approximately 700 mV. The current required to transport digital information, although low, remains relatively high, of the order of 3.5 mA. Consequently, the dynamic power required to generate the signals which transport the digital information is of the order of 2.1 mW, and cannot operate below a differential voltage swing of 700 mW.

In addition, bearing in mind the electrical impedance of the transmission line, the integrity of the transmitted signals cannot be guaranteed where transmission distances exceed 15 m. Moreover, this impedance prevents these electronic devices from addressing digital information from a single transmitter to a plurality of receivers because the signals are degraded when they are received.

The object of the present invention is therefore an electronic device which does not have the drawbacks of devices according to the prior art, especially excessive power consumption, a limited information transmission range and/or a high implementation cost and limits as far as the number of receivers are concerned.

SUMMARY OF THE INVENTION

The present invention therefore relates to a device which makes it possible to transport digital information over long distances simply and is economical to implement while having low power consumption and supporting "multi-addressing" of receivers, i.e. the possibility of a transmitter simultaneously addressing several receivers thanks to a novel use of electronic and magnetic components which operate in synergy and the use of magnetic elements in order to fulfill a logic circuit function. More precisely, these magnetic elements are magnetoresistive. As is customary, these magnetoresistive elements which comprise at least one hard ferromagnetic layer and one soft ferromagnetic layer separated by a non-ferromagnetic (metallic or insulating) interlayer are referred to hereinafter as "magnetoresistive stacks". In such stacks, one or other of the ferromagnetic layers or both of them may themselves comprise several ferromagnetic and non-ferromagnetic layers designed so that the assembly behaves like a single ferromagnetic layer with improved performance, forming what is referred to as a synthetic magnetic layer. In the text which follows, as is customary, the term "magnetic layer" will be used instead of "ferromagnetic layer".

The object of the invention is a device for transmitting digital information (a transceiver) comprising electronic means referred to as a transmitter which generates current pulses, and at least one assembly of means of reception referred to as a receiver which converts the received pulses into logic pulses which are compatible with the operation of standard electronic logic circuits.

According to the invention, the receiver receives the current pulses sent by the transmitter in a pair of magnetoresistive stacks, i.e. magnetoresistive elements which comprise a hard ferromagnetic layer and a soft ferromagnetic layer separated by an interlayer, the hard layer of each magnetoresistive stack being pinned in a fixed magnetic orientation, the soft layer of each track, in the absence of current, being in its easy magnetization direction which is used as a reference and having a magnetic orientation which can be varied by the magnetic field generated by the current pulses output by the transmitter so as to induce a change in resistance which is proportional to the geometrical angle between the magnetization of the hard layer and that of the soft layer which is sufficient to trigger a voltage or current signal with the resistance changes of the two stacks through which a single pulse flows cooperating with each other in order to form a differential signal.

The two stacks are preferably identical but excited in opposite directions by the current from the transmitter which has flown through the transmission line which connects the transmitter to the receiver in question, thus producing differential operation.

Usually, the easy-magnetization axis of the soft layer of each magnetoresistive stack is aligned with the magnetization of the hard layer: Thus, reversal of the magnetization of the hard layer between two stable positions (at 0 and 180 degrees relative to the easy-magnetization axis) makes it possible to obtain magnetic states which are parallel and anti-parallel to the magnetization of the hard layer, thereby maximizing the variations in resistance.

In the application referred to by the present invention, bistable operation is not necessary because the objective is actually to increase the processing speed. According to the invention, the magnetization will therefore not flip-flop between two stable states but will fluctuate (due to the effect of the magnetic field generated by the current pulses) around a stable position, preferably having an angle between −90 and 90° inclusive relative to the stable position. When the magnetic field is switched off, the magnetization returns to its equilibrium position. When this approach is adopted, the magnetic stacks may differ slightly from those used in a classic memory-type applications.

According to the invention, the magnetization of the hard layer is perpendicular to the easy-magnetization axis so as to bring the parallel and anti-parallel states closer together when the magnetization fluctuates between −90 and 90°, without actually reaching these values.

The magnetoresistive stacks are preferably realized so that the stability of the easy-magnetization axes is low, so that a weak magnetic field is sufficient to move them away from this position, the objective here not being to keep information stable, as in the case of memories.

This is generally achieved according to a first embodiment of the invention in which the magnetoresistive stacks are shaped like contacts having an almost cylindrical cross-section, in contrast to the elliptical cross-section of the contacts used in memories where the aim is to obtain two very stable states.

According to a second embodiment of the invention, the two magnetoresistive stacks are sufficiently close to each other for there to be magnetostatic coupling between their soft layers. In this case, a change in the orientation of the soft layer of one magnetoresistive stack contributes towards a change in the orientation of the other magnetoresistive stack. Thanks to this magnetostatic interaction, reversal of one of the soft layers contributes towards reversal of the other layer: This positive reaction of each stack to the other stack increases the switching rate and allows extremely high bandwidths.

In the second embodiment, it is preferable that the contacts have cross-sections shaped like two opposite-facing letter Cs or Us, rather than a circular cross-section, in order to minimize the air gaps which separate each stack from the other.

The modulation of the magnetic orientation of the soft layer of each stack is preferably sufficiently small for this magnetization orientation to vary around an equilibrium position without there being any reversal strictly speaking, i.e. when the current is switched off, the magnetization does not relax into its equilibrium position which is opposed to its initial equilibrium position. This configuration minimizes the energy required to modify their magnetic orientation and increases the switching rate.

Nevertheless, if this last preferred condition is not met and the magnetization does reverse in the absence of current, the operation of the transceiver is not affected by this. In fact, because the easy-magnetization axis of the soft layer is perpendicular to that of the hard layer, if it reverses 180°, the configuration is symmetrical with respect to the configuration before reversal and operation is also symmetrical.

According to the invention, the transmitter and the receiver (s) are mounted in series.

The expression "receives the current pulses in a pair of magnetoresistive stacks" is construed, in the sense of the invention, as denoting that these pulses flow through a conductor located in the vicinity of each of the magnetoresistive stacks with an orientation, direction and distance which are chosen so that these current pulses modify the magnetization orientation of the soft layer of each of these magnetoresistive stacks. As a result, this current does not cause any detectable voltage drop because the input impedance of the device is a single section of electrical conductor which passes nearby the two magnetoresistive stacks.

By way of example, in order to produce the 7 Oe field which is required in order to reverse a junction having a cylindrical cross-section, a 3 mA current is sufficient in a 1 m long line (i.e. almost infinite compared with the dimensions of the transceiver) having a cross-section which is 500 nm wide by 100 nm high located 200 nm from the junctions to be written.

The size of a junction being of the order of 300 nm, it is estimated that the length of the write line which is involved in reversing the junction is 1 µm. The write line is made of copper and the resistance of a 1 µm section is approximately 0.3 ohms.

For a write current of 3 mA, the power consumed in this junction is 2.7 µw whereas the LVDS standard requires, at a voltage of at least 0.6 V, a power of approximately 2 mW, i.e. 740 times higher. In addition, the LVDS standard requires a constant RI product whereas the invention makes do with a current equal to at least 3 mA which must only not reach a value high enough to cause undesirable reversal of another junction.

There is no detectable power dissipation in the receiver and the number of receivers which can be connected in series along a single electric line is extremely high and limited only by the total resistance of this line and the ability of the transmitter to generate the required current.

It should also be noted that there is practically no voltage operation threshold for a transceiver according to the invention. In addition, this almost zero input impedance significantly improves noise immunity. In fact, the electromagnetic noise can be modeled by a voltage source connected in series with an internal impedance $Z_0$ which is generally moderate or high or even very high. When noise induces a voltage in a circuit having impedance Zi, the latter is divided by the impedance ratio $Zi/(Z_0+Zi)$ in such a manner that reducing the input impedance of circuits is a known way of limiting the impact of electromagnetic noise. With an almost zero input impedance Zi, the invention offers perfect conditions hitherto never achieved for reducing noise vulnerability.

It goes without saying that, for those skilled in the art, the use of magnetoresistive stacks in the invention requires the presence, in the receiver, of an electronic integrated power supply circuit capable biasing the magnetoresistive part of the receiver and an integrated read circuit capable of measuring the resistance of the stack and converting it to logic levels.

In other words, the electronic device which is the object of the invention comprises a magnetically coupled transmitter and receiver, with the transmitter generating a write current in order to modify the magnetic orientation of the soft magnetic layers of each of the stacks in a pair of magnetoresistive stacks.

The transmitter consists of electronic means of generating, in a write loop, a current which locally generates a magnetic field in order to vary the magnetic orientation of the soft layers. Generally speaking, this is an electronic integrated circuit. In the receiver, this current flows through a conductor positioned with an orientation and at a distance which allows such modulation.

Because the same current flows in the vicinity of the two magnetoresistive stacks with an orientation and a distance which enable it to vary the magnetic orientation of the soft magnetic layer and because the output signals are associated and cooperate with each other, the pairs of magnetoresistive stacks deliver a differential signal which amplifies the wanted signal more than the artifacts which tend to affect common-mode magnetoresistances.

The magnetoresistive stacks are preferably voltage-biased by means of electrodes located either side of the stack relative to the plane of the layers, the electrical quantity measured being the current which flows through this magnetoresistive stack at right angles to the plane of the layers. But, in one alternative embodiment, the magnetoresistive stacks are current-biased and the electrical quantity measured is the potential difference between the ends of the magnetoresistive stack.

In one practical embodiment of the invention, the integrated circuits of the transmitter and the receiver can be realized using CMOS technology. The electronic device thus produced then combines CMOS technology and magnetic devices, especially magnetoresistive devices, of the type found in Magnetic Random Access Memories (MRAM). Although a combination of these two technologies is already used in the prior art when it is necessary to benefit from the functions offered by both technologies (for example in the case of magnetic memories having electronic implementing and multiplexing/demultiplexing circuits), this combination does not allow any synergies likely to result in performance better than that of the sum of the performances of each technology considered individually. There are also no logic circuits (in the sense of electronic logic circuits) which use magnetic components.

Another important aspect of the invention is the choice of the current of the electrical pulses which trigger the receiver. The magnetoresistive devices used in the receiver comprise a hard layer, the magnetization of which is fixed in a reference direction, and a soft layer designed so that its magnetization is as parallel or anti-parallel as possible to the magnetization direction of the hard layer during operation in order to maximize variations in resistance. The phrase "as possible" denotes that, although it is one of the designer's objectives, for certain shapes of the magnetic layers, particularly those shaped like the letter C or U, it is not possible to maintain anti-parallelism at every point of the magnetic layer. In the latter case the shape of the magnetic layers is nevertheless designed so that the overall behavior of the circuit or the behavior of portions thereof or the magnetic orientations of the hard layer and the soft layer are parallel or anti-parallel.

When a "0" or "1" logic signal is transmitted, the magnetic orientation of the soft layer shifts, as appropriate, preferably through an angle of −90 to 90 degrees. This is in contrast to magnetic memory devices where the desired shift is 180 degrees (reversal of magnetization direction). This shift in the magnetic orientation of the soft layer of slightly less than ±90 degrees requires a magnetic field weaker that the magnetic field required to obtain reversal which is used in memories.

In the absence of current in the line which links the transmitter to the receiver, the soft layer of each magnetoresistive stack is oriented along the easy-magnetization axis (cf. FIG. 4A) perpendicular to the magnetization of the hard layer. Modulation of its magnetic orientation relative to its orientation in the idle state in order to obtain one of two unstable states each reproducibly and reliably generated by a current pulse in one of two directions, depending whether the transmitted value is 0 or 1, is characteristic of the invention (cf. FIGS. 4B and 4C).

Choosing a current pulse to modulate this orientation by ±90 degrees relative to its equilibrium position, depending whether the received signal is a logical "0" or "1", is a preferred embodiment in that it maximizes the Tunnel MagnetoResistance (TMR) (which represents the relative variation in ohmic resistance between the extreme orientation states) when the angle between the magnetic orientation of the hard layer and that of the soft layer is 0° or 180°.

However, modulation by an angle of less than 90° is also in conformity with the invention if it allows a detectable, reproducible and reliable variation in the transverse electrical resistance of each magnetic stack. This enables those skilled in the art to adapt the principle of the invention to obtain various special configurations, for example in order to reduce power consumption or increase the switching rate of the entire transceiver.

A third important aspect of the invention is the stability of the magnetic states. In magnetoresistive memory devices, attempts are made to achieve highly stable magnetic states and, generally speaking, this results in choosing an oval shape, which is fairly different from a circle, as the shape of the magnetic layers which constitute the magnetoresistive stack. In contrast, in the invention the aim is to obtain two magnetic states which are relatively unstable and never need to be maintained for a long time. This relative instability also helps to reduce the response time and hence increase the maximum switching rate. Thus, the magnetic junctions preferably have a rotund shape which minimizes this stability or a shape similar to that of a circle. By way of example, magnetization reversal in a round junction is typically 5 to 7 œ, whereas it would be 50 to 70 œ in the case of a similar junction having an oval shape as conventionally used in memories. In an alternative embodiment, this relative instability can be obtained by carefully choosing the magnetic materials which constitute each magnetoresistor or by a combination of the choice of materials and the shape of the magnetoresistive stack.

According to one preferred embodiment of the invention, the pairs of magnetoresistive stacks have their soft magnetic layers positioned so that there is sufficiently strong magnetostatic coupling between them for reversal of one of these soft layers to cause reversal of the other soft layer in the opposite direction, with their magnetizations always remaining anti-parallel.

Such a structure makes it possible to minimize the current which flows in the via which connects the two legs of the loop of the write circuit because such magnetostatic coupling makes it easier to modulate the magnetic orientation of the soft layers. Such magnetostatic coupling also helps maintain the two magnetic junctions in opposite magnetic orientations and this accentuates differential operation.

In one preferred alternative of the above embodiment, the two elements of each pair of magnetoresistive stacks are positioned on the same side of a single substrate and magnetic coupling between their soft layers is obtained by giving each of these stacks a C-shaped geometry and by placing these two elements face-to-face with the openings of the two letter Cs facing each other.

In other words, the two magnetoresistive stacks in a pair can consist of C-shaped elements positioned in the same plane so as to define, between them, two air gaps and essentially form a crown on the axis of symmetry of which there is a via which links the legs of the write loop. Such a structure makes it possible to increase the magnetostatic coupling between the two magnetoresistive stacks and to create positive feedback between a change in the orientation of one of the soft layers and a change in the orientation of the other soft layer, with this coupling tending to keep them anti-parallel. Advantageously, the letter C is deformed in order to ensure functional preponderance of those areas where the soft layer has a magnetic orientation which is parallel or anti-parallel to that of the hard layer.

In a second preferred alternative, the two elements of each pair of magnetoresistive stacks are positioned on the same side of a single substrate and magnetic coupling between their soft layers is obtained by giving each of these stacks a U-shaped geometry and by placing these two elements face-to-face with the openings of the two letter Us facing each other.

Advantageously, the letter U is deformed in order to ensure functional preponderance of those areas where the soft layer has a magnetic orientation which is anti-parallel to that of the hard layer. Thus, the second alternative can be improved further still by forming the U not as two parallel legs which are joined by a semicircle but as two parallel legs which are joined by a third perpendicular leg, the length of which is less than the parallel legs and advantageously as short as possible. By way of example, one can connect two parallel legs having a length L by a perpendicular leg having a length $L' \leqq L$, $L'$ being the length measured between the two legs.

Magnetoresistive coupling makes it possible and advantageous to reverse the magnetoresistive elements by using a current which is weaker than that which is used in magnetoresistive elements used for storage purposes. Besides this, less saturation encourages rapid reversal and hence a high transceiver operating frequency.

Such junctions actually offer attractive performance, especially in terms of their magnetic-field response times.

In an alternative embodiment of the invention, the magnetic tunnel junctions can be magnetically independent of each other.

In a practical implementation of this embodiment of the invention, the magnetoresistive elements can each consist of a cylindrical contact.

Such a geometry makes it possible to orientate the soft layers relatively easily, i.e. with low power consumption, and to obtain magnetization with relatively high-speed responsiveness (in sensor mode with a hard layer oriented at 90 degrees).

According to one particular aspect of the invention, the magnetoresistive elements can each consist of a magnetic tunnel junction.

In practice, the magnetic tunnel junctions may be made of magnesium oxide (MgO) and the electrodes may be made from alloys of iron, cobalt and/or boron.

In practice, the integrated read circuit may be capable of amplifying the current difference in order to generate a voltage which is representative of the electrical resistance of the resistive elements.

Thus, the read circuit outputs a voltage-modulated signal which can easily be analyzed by appropriate peripherals such as those realized using CMOS technology.

According to one embodiment of invention, the electronic device which is the object of the invention may comprise several receivers which are magnetically coupled in series to the transmitter via write legs.

In practice, all these receivers may be affected identically by the write current.

This embodiment of the invention makes it possible to address the same digital information to several receivers by using a single write line.

Once again, in practice the soft layers may each have low magnetic anisotropy in order to enable their magnetic orientations to be modulated at high speed with relatively low energy consumption.

Thus, the voltage drop along the write line has no impact on the receiver so that repeaters or amplifiers can be dispensed with while nevertheless preserving the integrity of the signal. The energy cost is identical for one or several receivers.

In one advantageous embodiment of the invention, the magnetic junctions may have a small resistance area and a high magnetoresistance, preferably in excess of 200%. This increases the bit transmission rate because the magnetic conversion rate is in excess of the velocity of electricity (CMOS).

BRIEF DESCRIPTION OF THE DRAWINGS

The way in which the invention can be implemented and its resulting advantages will be made more readily understandable by the description of the following embodiment. This example is given merely by way of example and is not limitative, reference being made to the accompanying drawings which include:

FIG. 2A shows transport of a "0" digital signal whereas FIG. 2B shows transport of a "1" digital signal;

FIGS. 4A, 4B and 4C respectively show the magnetoresistive device when it is idle, when a "0" is transmitted and when a "1" is transmitted;

DETAILED DESCRIPTION OF THE INVENTION

Figure 1:
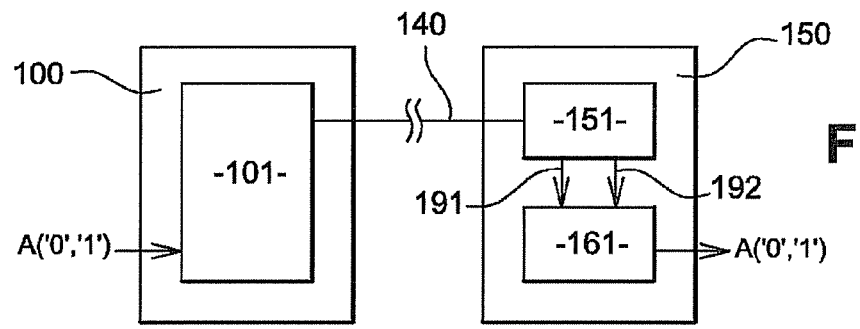
FIG. 1 is a schematic view of the transmitter and receiver units of an electronic device according to the invention.

FIG. 1 shows the units which make up an electronic device in accordance with the invention. A transmitter 100 comprising an integrated circuit 101 is designed to write to the first stage 151 of a receiver 150 via a write loop 140. The term "write" actually denotes the output of electrical signals by current modulation from integrated write circuit 101 to the first stage 151 of receiver 150. Receiver 150 also comprises an integrated read circuit 161 which is electrically connected to first stage 151 via connections 191 and 192.

The length of write loop or line 140 represents the distance over which the "0" and "1" digital signals are transported. Obviously, the digital information (signals) reach integrated write circuit 101 from a source situated upstream and shown schematically in FIG. 1. Similarly, integrated read circuit 161 of receiver 150 transmits digital information originating from magnetoresistive stage 151 which it has decoded to one or more other components capable of analyzing these digital signals.

Figure 2A:
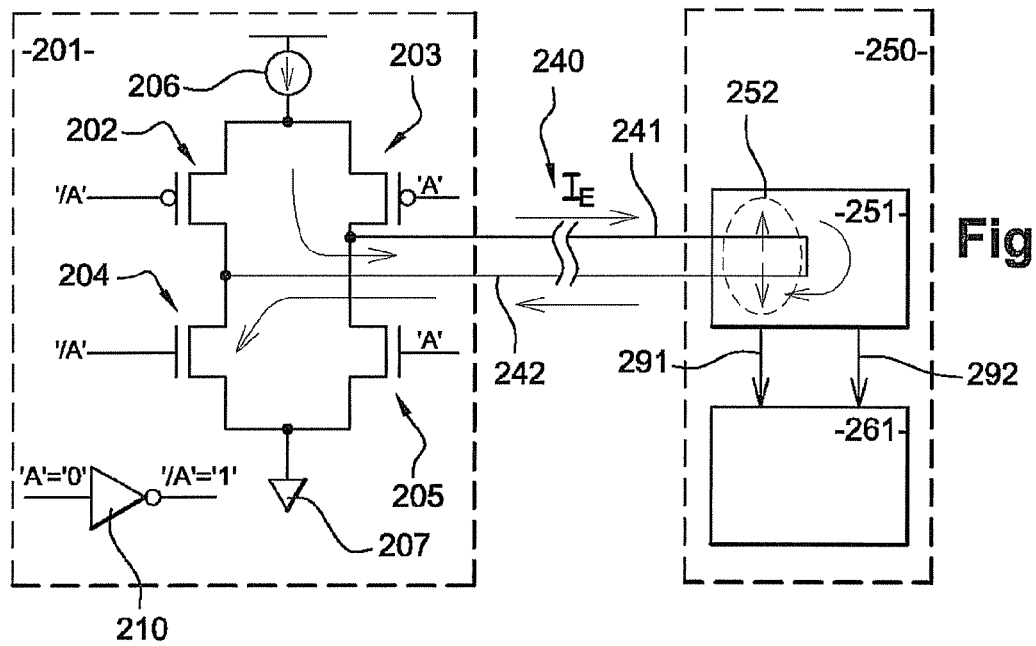
FIGS. 2A and 2B are schematic views of the electronic device illustrated in FIG. 1; these Figures show details of the integrated circuit which constitutes the transmitter and the magnetoresistive device which constitutes the first stage of the receiver.
Figure 2B:
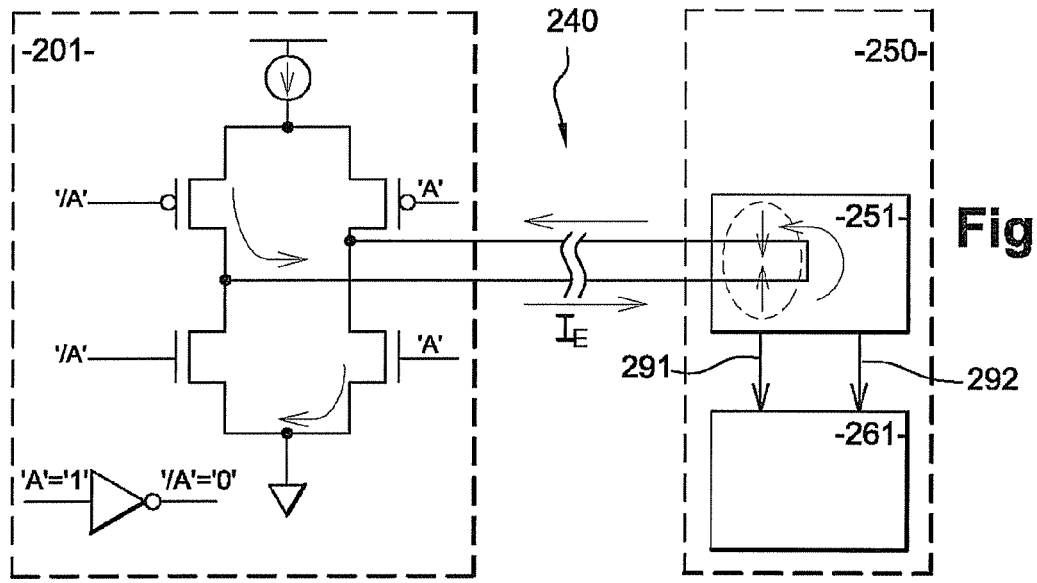

FIGS. 2A and 2B illustrate in greater detail the operation of the electronic device shown schematically in FIG. 1. In these Figures, the reference numbers which denote parts that are comparable to those in FIG. 1 are incremented by 100.

According to the invention, integrated write circuit 201 is implemented entirely using CMOS technology. This write circuit 201 comprises four transistors 202-205 mounted in parallel, two by two. In fact, the transistors in pair 202-203 are of the Positive Metal Oxide Semiconductor (PMOS) type whereas the transistors in pair 204-205 are of the Negative Metal Oxide Semiconductor (NMOS) type.

PMOS transistors 202-203 (symbolized by a circle on their gates) have their common sources (connected to the current generator) whereas NMOS transistors 204-205 have their common sources connected to ground 207.

The common source is powered by current generator 206 which delivers a current which can be less than 3 mA and, in practice, is less than the current required to operate a device which uses the LVDS standard (3.5 mA).

Moreover, integrated write circuit 201 operates in a similar manner to the integrated circuits of transmitters used with the LVDS standard. Besides this, transistors 202 and 204 are connected to the output of NOT gate 210, whereas transistors 203 and 205 are connected to the input of NOT gate 210.

Consequently, if the logic signal to be transmitted, applied to the input of the NOT gate, is "'A'=0", transistors 203 and 204 are in the ON state whereas transistors 202 and 205 are in the OFF state and, conversely, if "'A'=1", the PMOS transistors are active if their gate is logical "0" and the NMOS transistors are active if their gate is logical "1"; this makes it possible to ensure bidirectional current flow in loop 240.

Consequently, if "'A'=0", the current originating from the source connected to current generator 206 flows through transistor 203 to leg 241 of write line 240 and reaches the magnetoresistive stage 251 of receiver 250. Because legs 241 and 242 actually form a loop 240, this current returns via leg 242 to transmitter 201 or flows through transistor 204 to common source/ground 207. This way, the digital signal "0" has been transported from transmitter 201 to receiver 251 via write loop 240. Conversely, FIG. 2B shows the transport of digital signal "1" through write line 240. To achieve this, voltage is applied to the input of NOT gate 210, thereby setting its output to zero volt (0 V).

Because the write current flows in legs 241 and 242 in opposite directions (outbound or return), it is sometimes referred to as a bidirectional current. According to the invention, this current reaches stage 251 of receiver 250 and flows close to the magnetoresistive device which is characteristic of the present invention. The operation of this magnetoresistive device is detailed below and it is shown schematically in FIGS. 2A and 2B.

Ellipse 252 denotes the magnetic orientations of a soft ferromagnetic layer which is part of one of the magnetoresistive elements of the device which constitutes magnetic stage 251 of receiver 250. The arrows inside ellipse 252 symbolize the coercive magnetic fields generated locally by the write current. According to the invention, the soft ferromagnetic layers are formed by magnetic tunnel junctions. As shown in FIGS. 2A and 2B, these magnetic junctions, according to the invention, are constantly in phase opposition to each other. In this particular case, the magnetic junctions are therefore magnetically coupled.

Figure 3A:
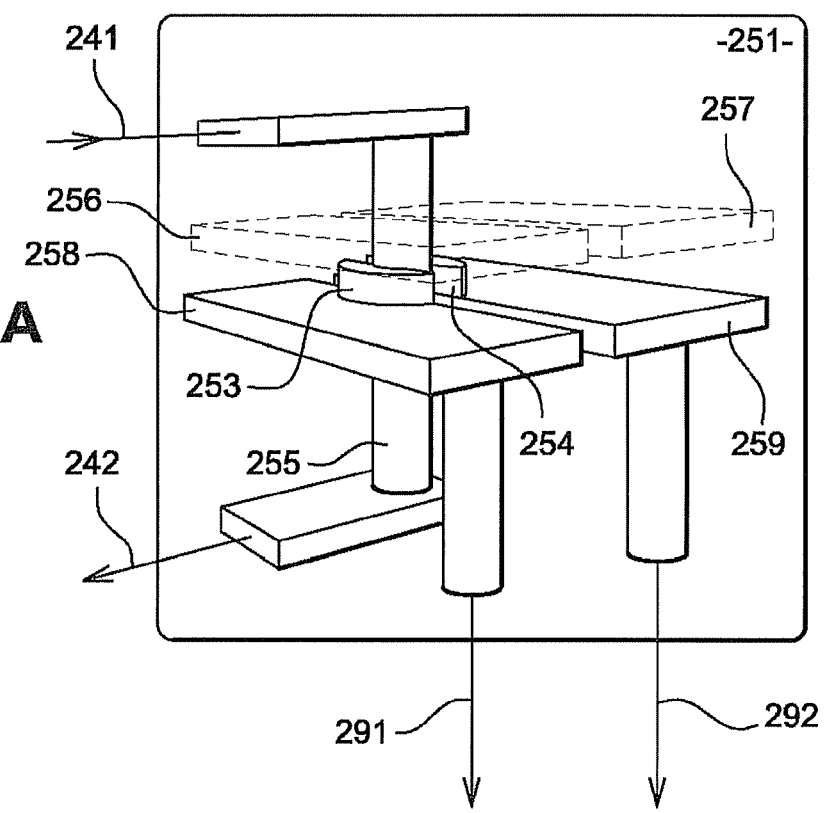
FIGS. 3A and 3B are perspective schematic views of two different architectures which make it possible to realize the magnetoresistive device of the receiver for a device according to the present invention.

FIG. 3A shows the architecture of magnetoresistive device 251 with two magnetically coupled C-shaped magnetoresistive elements 253, 254. Write current $I_E$ arrives here via leg 241 and leaves via leg 242. Between these two legs, write current $I_E$ passes through a via 255 consisting of an electrical conductor which runs at an equal distance from magnetoresistive elements 253 and 254. These C-shaped, or half-ring shaped, elements 253 and 254 face one another whereas via 255 is located coaxially with respect to the axis of symmetry of the assembly formed by the two magnetoresistive elements 253 and 254.

Thus, the write current which transports the digital signal "0" or "1" generates a magnetic field at the level of magnetoresistive elements 253 and 254. Each of magnetoresistive elements 253 and 254 comprises a hard ferromagnetic layer (not shown) and a soft ferromagnetic layer (not shown). These two layers are separated by an interlayer (not shown). Nevertheless, magnetoresistive elements 253 and 254 may also comprise a stack of several layers made of different magnetic or amagnetic materials.

Consequently, there is no direct electrical contact between the integrated write circuit and magnetic stage 251 of the receiver. This is why write current $I_E$ is not influenced or altered when it flows through loop 240 formed by legs 241 and 242. As explained below in relation to FIG. 6, this property makes it possible to address the same digital information from a single transmitter to several receivers. In contrast, in the case of electronic devices which operate according to LVDS standards, a differential voltage is generated across the two legs of the write line and is read at the level of the receiver. The information-bearing current is therefore altered in the receiver at the time the voltage difference between the legs is measured and this prevents transmitting the same information to other receivers.

As is known, for example in the field of Magnetic Random Access Memories (MRAM), the hard layer of each of the magnetoresistive elements is pinned in a fixed magnetic orientation which is used as a reference whereas each soft layer has a variable magnetic orientation. It is specifically the magnetic orientation of the two soft layers which is modified by passing the write current through via 255. The resistance of the stack thus produced depends on the angular difference between the magnetic moments of the two layers. The angle, referenced relative to the easy-magnetization axis, is zero for the hard layer and the resistance therefore depends only on the angle between the magnetic moment of the soft layer and the latter's easy-magnetization axis.

According to the invention, magnetoresistive device 251 is electrically connected to integrated read circuit 261 via conductors 291 and 292. In accordance with a known principle, the integrated read circuit measures the value of the electrical resistance of each of magnetoresistive elements 253 and 254 by injecting a read current via conductors 291 and 292.

Magnetoresistive device 251 therefore makes it possible to detect variations in the local magnetic field produced by the write current when it flows through via 255 which forms a differential connection. Magnetoresistive device 251 therefore converts the digital signal transported by the write current into a variation of an electrical quantity which second stage 261 can interpret. The operation of the second stage is described below in relation to FIG. 5.

As explained above, the two magnetic tunnel junctions formed by magnetoresistive elements 253 and 254 are magnetostatically coupled to each other so that their orientations are constantly in phase opposition. Such a structure therefore makes it possible to minimize the write current which must flow through via 255 in order to modulate the magnetic orientations of the soft layers of elements 253 and 254. In fact, the magnetostatic coupling between elements 253 and 254 "duplicates" the variation in the magnetic orientation of either of the soft layers.

Thus, even a small variation in magnetic orientation can be measured by using the read current. In fact, given the variation in the resistance of each of elements 253 and 254, when the magnetic junctions are biased via electrodes 256 and 257 which are, respectively, in contact with elements 253 and 254, read circuit 261 collects the different currents from both conductors 291 and 292. Subsequently, integrated read circuit 251 implemented using CMOS technology can amplify this current difference in order to retranscribe the digital information which it represents ("0" or "1") in the form of a voltage.

Figure 3B:
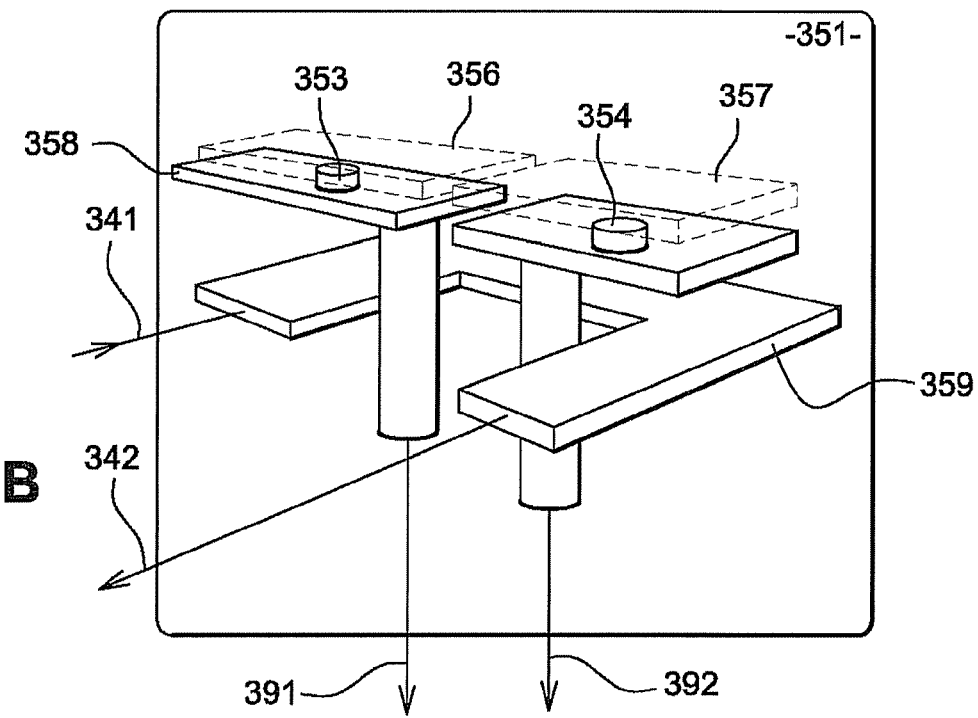

FIG. 3B illustrates an alternative architecture to that of magnetoresistive device 251. Because the operation of magnetoresistive device 351 shown in FIG. 3B is similar to that of magnetoresistive device 251 in FIG. 3A, it is not explained here in detail, except to emphasize its distinctive features.

The two magnetoresistive elements 353 and 354 here are actually magnetically independent of each other. These magnetoresistive elements 353 and 354 can be formed by conventional magnetic tunnel junctions, for example junctions having a stack of materials identical to those used in Magnetic Random Access Memories (MRAM).

In particular, the soft ferromagnetic layers of this magnetic junction may have a circular or almost circular shape so as to minimize the energy, and hence the write current, required in order to modulate their magnetic orientation.

In contrast to MRAMs, the aim here is not stable non-volatile storage of information but high-speed transfer with low power consumption. This is why circular-shaped soft layers produce low switching thresholds and dynamic response of the soft layer, i.e. significant potential for modulating its orientation. These last two parameters make it possible to achieve free-layer magnetization cycles with extremely fast response times and this increases the rate at which digital information can be read as it reaches the receiver accordingly.

Figure 4A:
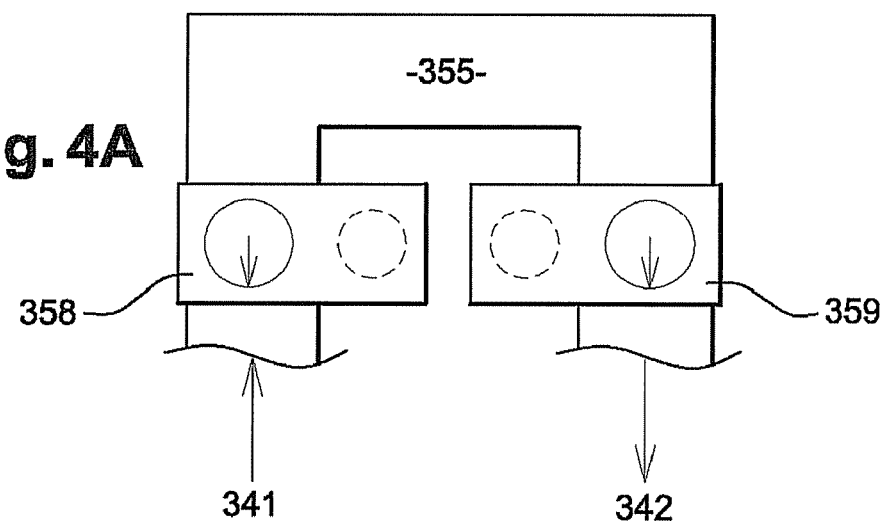
FIGS. 4A to 4C illustrate the operation of the magnetoresistive device shown in FIG. 3B, especially the magnetic orientations of the soft layers of the magnetoresistive elements of such a device.
Figure 4B:
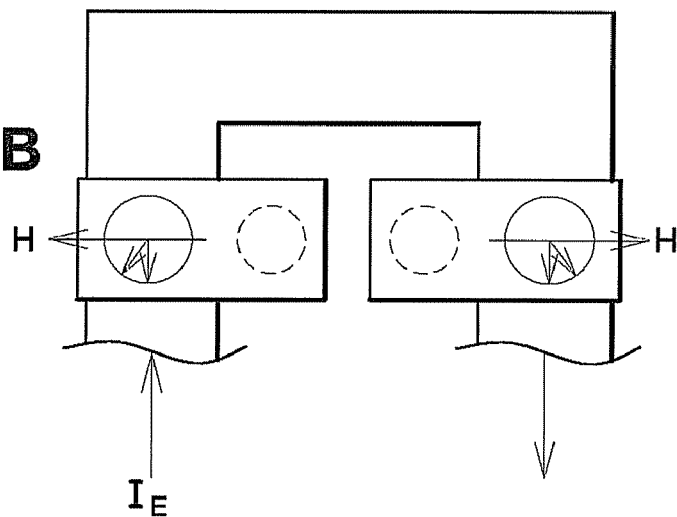
Figure 4C:
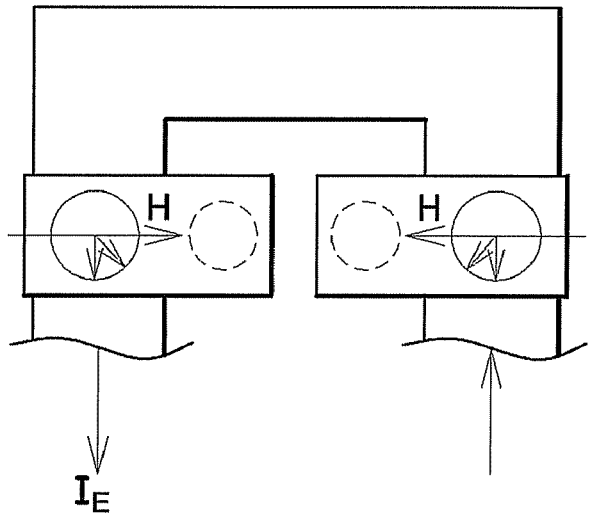

FIGS. 4A to 4C show various phases of the operation of magnetoresistive device 351 which is illustrated in FIG. 3B. FIG. 4A shows magnetoresistive device 351 in the idle state, FIG. 4B shows transmission of a "0" and FIG. 4C shows transmission of a "1."

These FIGS. 4A to 4C show the end of the write loop as well as the two legs 341 and 342 which constitute it. Two electrodes 358 and 359 are used to bias magnetoresistive elements 353 and 354. Electrodes 358 and 359 are each shown with a solid-line circle symbolizing the magnetic orientation of the soft layer of the corresponding magnetoresistive element as well as with a dotted-line circle which represents each of conductors 391 and 392 which link "magnetic" stage 351 to the receiver's electronic read stage.

In a receiver in accordance with the present invention, received digital signals are detected by the CMOS read circuit in a magnetic field. The local magnetic field H generated by the write current flowing through legs 341 and 342 must therefore stabilize the magnetic orientations of magnetoresistive elements 353 and 354 during the read phase performed by the CMOS circuit located downstream from magnetoresistive device 351.

The duration of this read phase performed by the CMOS circuit depends on the absolute and relative values of the current generated by biasing between electrodes 356 and 358 on the one hand and electrodes 357 and 359 on the other hand. The value of the bias current must therefore be maximized in order to minimize the duration of this read phase. Making allowance for fluctuation problems which affect magnetic and electronic processes in the CMOS circuit, it is necessary to choose a low nominal resistance (short time constant) for each magnetic junction and high tunnel magnetoresistance.

Looking at the left-hand area of FIG. 4A, in particular near electrode 358, the magnetic field H generated locally by the write current is horizontal here in the plane of the Figure and oriented to the left. The downward vertical arrow in the magnetic circle denotes the reference orientation of the hard ferromagnetic layer. In the case of FIG. 4A, the orientation of the soft ferromagnetic layer is also vertical and downward because here the device is in the idle state.

In the case of FIG. 4B, a "0" digital signal is to be transported. To achieve this, the CMOS write circuit applies write current $I_E$ to leg 341 in order to locally generate a horizontal magnetic field H in the plane of the Figure and oriented outwardly (to the left in the left-hand area of the Figure). In the vicinity of magnetoresistive element 353, this magnetic field H modifies the magnetic orientation of the soft layer and this is illustrated by the arrow inside the circle which points obliquely downwards and to the left. This magnetic state, combined with the symmetrical state of element 354 shown in the right-hand area of FIG. 4B, reflects receiving a "0."

Conversely, FIG. 4C shows the reception of a "1" digital signal. To achieve this, the CMOS write circuit applies a write current to leg 342 and this current returns via leg 341. In the vicinity of element 353 (left-hand area of FIG. 4C), local magnetic field H is then oriented horizontally in the plane of the Figure and inwardly (to the right in the left-hand area of the Figure). The hard reference layer is obviously still oriented in the direction of the vertical downward arrow whereas the soft layer is now oriented downwards and to the right. This magnetic orientation corresponds to a "1" digital signal.

The electrical resistance of elements 353 and 354 is thus different depending whether they are oriented as shown in FIG. 4B or as shown in FIG. 4C. As is known, the electrical resistance of a stack of magnetic layers is given, by way of initial approximation (low bias voltage and ambient temperature), by the equation:

$$R=R_{p'} \cdot (1+TMR \cdot (1-\cos \theta)/2) \quad [I]$$

where:
- $R_{p'}$ is the nominal resistance of the junction when the magnetizations of the two layers of the stack are oriented in the same direction;
- TMR represents the tunnel magnetoresistance, i.e. the relative variation in resistance between the extreme orientation states;
- $\theta$ is the angle formed between the orientations of the hard layers and the soft layers.

When $\theta$ equals 0, the magnetic junction is in a parallel state where the resistance has assumed its minimum value and is $R=R_p$, but when $\theta=\pi$, the magnetic junction is in an antiparallel state and its electrical resistance assumes its maximum value and is $R=R_{p'} \cdot (1+TMR)$. In the embodiment of the invention illustrated in FIGS. 4A to 4C, the magnetization of the hard layer (vertical downward arrow) is oriented at 90° relative to the stable orientation of the soft layer defined by its magnetocrystalline anisotropy. Moreover, because the structure of magnetoresistive elements 353 and 354 is circular, this makes it possible to eliminate any shape effect and hence minimize the write current required in order to obtain magnetic orientation of the soft layer.

With the architecture shown in FIGS. 4A to 4C, the magnetization of the soft layer fluctuates around its equilibrium position (vertical downward arrow) with a maximum angular variation of 90°. These relatively small fluctuations make it possible to limit the absolute value of write current $I_E$ to 3 mA.

Nevertheless, the angle formed between the orientations of the soft layer and the hard layer of each of the magnetic junctions of elements 353 and 354 can be modulated between 0° and 180°. This amplitude modulation makes it possible to maximize the relative variation in Tunnel MagnetoResistance (TMR).

If $V_{bias}$ is the bias voltage across the terminals of elements 353 and 354 and taking into account the expression of the electrical resistance of these elements (equation I), the differential read current is expressed by the equation:

$$\Delta i_{read} = (Vb_{ias}/R_p) \cdot (TMR/(1+TMR)) \quad [II]$$

if a "0" is transmitted, whereas if a "1" is transmitted, the differential read current becomes:

$$\Delta i_{read} = -(Vb_{ias}/R_p) \cdot (TMR/(1+TMR)) \quad [III]$$

As explained earlier, the CMOS read circuit is capable of amplifying this differential read current $\Delta i_{read}$, and then converting it into a voltage which is representative of the transported digital signal, a "0" or a "1".

To form the magnetic junctions described here, one can use a layer of magnesium oxide (MgO), which makes it possible to obtain high TMR, having a small thickness in order to obtain a relatively low nominal resistance. In fact, the nominal resistance $R_p$ of the stack of magnetoresistive elements is approximately 1Ω. To bias the magnetoresistive elements, electrodes 356-359 consist of layers comprising iron, cobalt and boron (B) and typically CoFe/CoFeB layers. Such a stack of electrodes and junctions actually gives interesting experimental results in terms of tunnel magnetoresistance (TMR) which can be as high as 350%.

Also, the bias voltage used is $V_{bias}=300$ mV and this makes it possible to limit the drop in tunnel magnetoresistance (TMR) which decreases as the applied bias voltage rises. Differential read current $\Delta i_{read}$ reaches an absolute value of 230 μA; this current is easily sufficient to rapidly detect the digital signal received in the CMOS read circuit described below in relation to FIG. 5.

Figure 5:
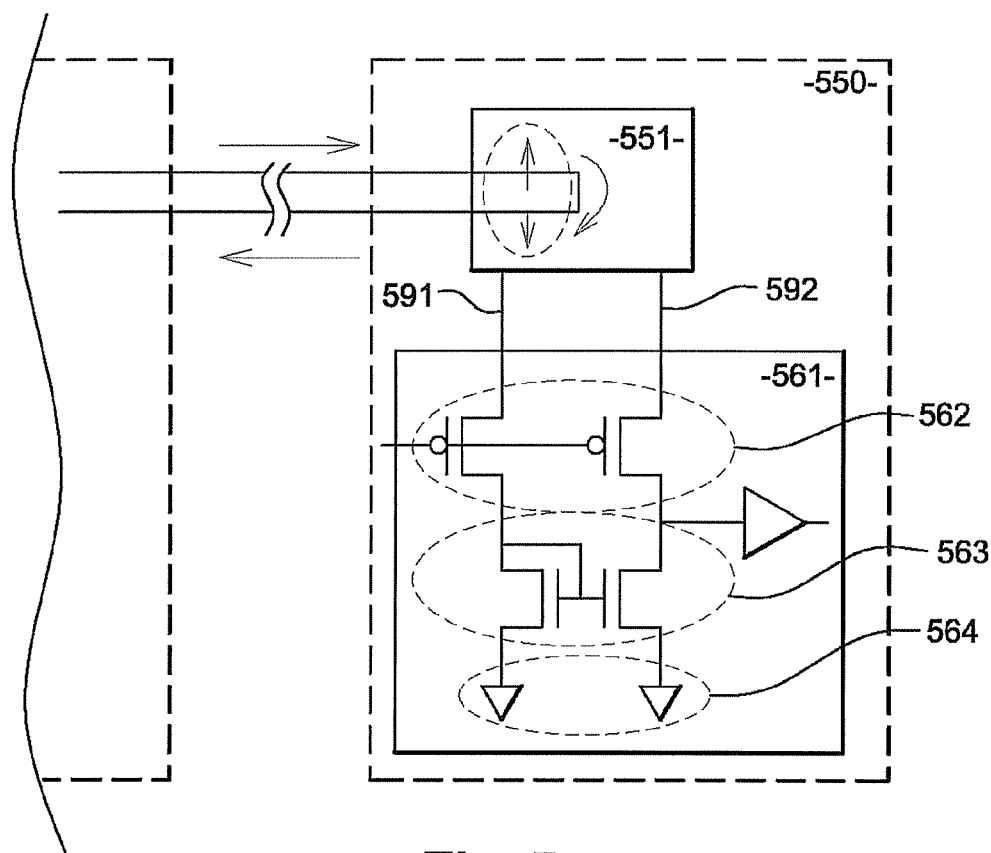
FIG. 5 is a schematic view of an integrated read circuit which constitutes the second stage of the receiver of an electronic device according to the invention.

FIG. 5 shows a receiver 550 comprising a magnetic stage 551 which has already been described and an integrated read circuit 561 which is electrically connected to magnetic stage 551 via two conductors 591 and 592.

According to the invention, the electronic read circuit can be implemented using CMOS technology and be associated with a pair of PMOS transistors, the gates of which are connected in order to form a voltage clamp circuit (voltage limiter). These two clamp transistors are used to limit bias voltage $V_{bias}$ of the magnetic junctions by means of an adjustment made by varying voltage $V_{clamp}$ which is applied to the two gates.

As shown in FIG. 5, the currents from the drains of each of these PMOS are then compared by using a current-mirror differentiator 563. To form such a current-mirror differentiator, one uses two NMOS transistors, the gates of which are held at the potential of each other's drain so as to generate differential current $\Delta i_{read}$ which drives the output buffer.

Depending on the direction of the current which flows in this read circuit, the current-mirror differentiator charges or discharges an output stage formed by a buffer element 564. The purpose of this buffer is to regenerate the digital signals transmitted by the transmitter by converting them into a voltage which is compatible with the logic levels of the CMOS components which constitute the peripherals located downstream from the electronic device which is the object of the present invention. The voltage generated by buffer element 564 as a function of the differential read current is obviously representative of the digital information initially sent by the integrated write circuit.

Figure 6:
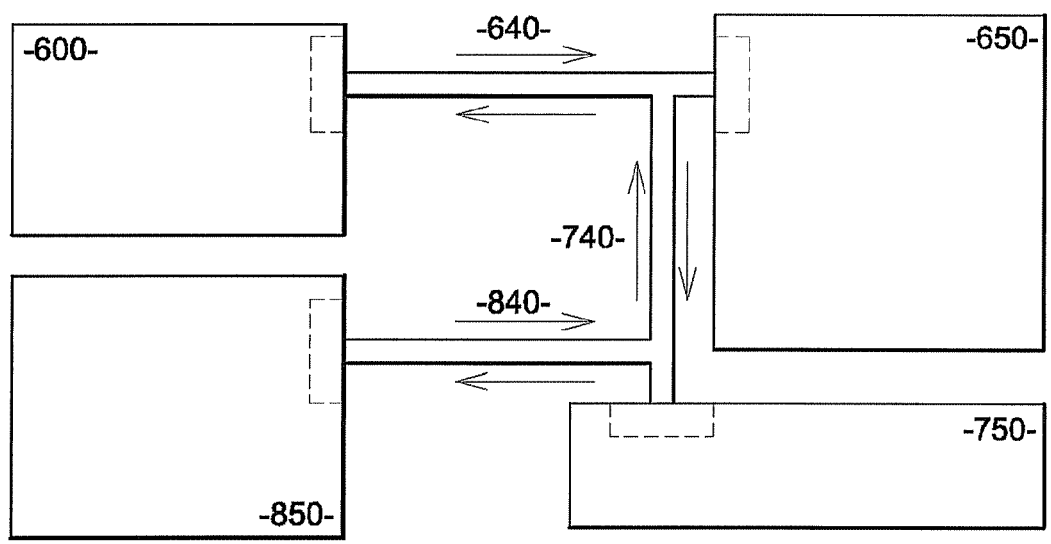
FIG. 6 is a schematic block diagram showing multi-addressing of digital information from one transmitter to several receivers.

FIG. 6 shows an embodiment of the electronic device which is the object of the present invention in which a transmitter 600 addresses identical digital information to several receivers 650, 750 and 850. This multiple addressing, sometimes referred to as "multidrop", is made possible by the fact that the write current is not influenced or altered by the magnetic stages of the receivers, so the write current can be successively transported by lines 640, 740 and 840 etc. . . . to an equivalent number of receivers. The only limiting factor as far as the number of receivers is concerned is the length of loop 640-740-840 through which the write current must pass.

Besides this, the digital signals propagate through the write lines at the wave propagation speed in these lines in contrast, for instance, to parallel current distribution where information arrives simultaneously at various receivers which are equidistant from the transmitter.

The object of the present invention makes it possible to implement a multi-addressing procedure for digital information which is relatively simple, economical and consumes little energy.

It should be noted that, in order to conserve good noise immunity, the differential nature of the links between the various components must be maintained for as long as possible and this requires routing management and special-purpose interconnections. It is also possible to obtain parallel distribution but this requires more write power and hence a higher energy consumption which can be partially compensated by using very low-impedance lines.

Other methods of implementing the invention are possible without thereby extending beyond the scope of this invention.

The invention claimed is:

1. An electronic device designed to transport digital information ("0", "1") over long distances comprising a transmitter, generating current pulses and at least one assembly of means of receiving or receivers, converting the received current pulses into logic pulses which are compatible with the operation of standard electronic logic circuits, wherein the receiver comprises a pair of magnetoresistive stacks comprising at least one hard ferromagnetic layer and one soft ferromagnetic layer separated by a non-ferromagnetic interlayer, the hard layer of each of the magnetoresistive stacks being pinned in a magnetic orientation perpendicular to an easy-magnetization axis which is used as a reference for the soft layer of the same stack, this soft layer of each of the magnetoresistive stacks having a magnetic orientation which can be modulated by the magnetic field generated by the current pulses output by the transmitter so as to produce a modification in the transverse resistance of the stack which is sufficient to trigger an electrical signal, the modifications in the resistance of the two stacks through which a single pulse passes cooperating in order to form a differential signal, the modulation of the magnetic orientation of the soft layer of each stack being sufficiently small for this orientation not to reverse between two stable positions but to fluctuate around a stable position.

2. An electronic device as claimed in claim 1, wherein a current pulse generated by the transmitter causes the magnetic orientation of the soft layer of the first stack to vary by an angle $\theta$ of 0 to 90°, the precise value 90° never actually been reached, producing a variation $V_1$ in a first direction of the transverse resistance of this first stack and causing the magnetic orientation of the soft layer of the second stack to reverse by angle $\theta$, producing a variation $V_2$ in the transverse resistance of the stack, $V_1$ and $V_2$ being used by a read circuit which delivers an output signal as a function of $V_1-V_2$ which is referred to as a differential signal.

3. An electronic device as claimed in claim 1, wherein transmitter and receiver(s) are mounted in series, and transmitter consists of electronic means, especially consisting of an integrated circuit, capable of generating in write loop a current which locally generates a magnetic field (H) sufficiently strong to modulate the magnetic orientation of the soft layers.

4. An electronic device as claimed in claim 1, wherein the receiver incorporates an electronic integrated read circuit capable of biasing the magnetoresistive part of the receiver and determining its electrical resistance in order to decode received signals, said integrated circuit being electrically connected to the magnetoresistive elements of the receiver.

5. An electronic device as claimed in claim 1, wherein magnetoresistive stacks are voltage biased by means of electrodes, the electrical quantity measured consisting of the current difference between said magnetoresistive elements.

6. An electronic device as claimed in claim 4, wherein the integrated circuits of the transmitter and of the receiver are implemented using CMOS technology.

7. An electronic device as claimed in claim 1, wherein the soft layers of the magnetoresistive stacks of the receiver(s) are magnetostatically coupled to each other so that reversal of one of these soft layers causes reversal of the other soft layer in the opposite direction, with their magnetizations always remaining anti-parallel.

8. An electronic device as claimed in claim 7, wherein magnetoresistive stacks are located on the same side of a single substrate and in that their soft layers are obtained by giving each element a C-shaped geometry and placing the two elements face-to-face with the openings of the Cs facing each other.

9. An electronic device as claimed in claim 7, wherein the magnetoresistive stacks in a pair consist of C-shaped elements positioned in the same plane so as to define, between them, two air gaps and essentially form a crown on the axis of symmetry of which there is a via which links the legs of write loop.

10. An electronic device as claimed in claim 7, wherein the magnetoresistive stacks in a pair consist of U-shaped elements positioned in the same plane so as to define, between them, two air gaps and essentially form a crown on the axis of symmetry of which there is a via which links the legs of write loop.

11. An electronic device as claimed in claim 7, wherein magnetoresistive stacks are located on the same side of a single substrate and in that their soft layers are obtained by giving each element a U-shaped geometry and placing the two elements face-to-face with the openings of the Us facing each other.

12. An electronic device as claimed in claim 10, wherein the letter U is deformed in order to ensure functional preponderance of those areas where the soft layer has a magnetic orientation which is anti-parallel to that of the hard layer, said U consisting of two parallel legs which are joined by a third perpendicular leg, the length of which is less than the parallel legs and advantageously as short as possible.

13. An electronic device as claimed in claim 1, wherein magnetoresistive stacks each consist of a cylindrical contact.

14. An electronic device as claimed in claim 1, wherein magnetoresistive stacks each consist of a magnetic tunnel junction.

15. An electronic device as claimed in claim 14, wherein the magnetic junctions are made of magnesium oxide (MgO) and the electrodes are made from alloys of iron, cobalt and/or boron.

16. An electronic device as claimed in claim 1, wherein it comprises several receivers magnetically coupled in series to transmitter via a write loop.

17. An electronic device as claimed in claim 12, wherein the magnetic junctions have a small resistance area and a high magnetoresistance, preferably in excess of 200%.

* * * * *